(12) United States Patent
Lee et al.

(10) Patent No.: US 11,627,672 B2
(45) Date of Patent: *Apr. 11, 2023

(54) DISPLAY APPARATUS INCLUDING FRAME FOR SUPPORTING PRINTED CIRCUIT BOARD

(71) Applicant: SAMSUNG ELECTRONICS CO., LTD., Suwon-si (KR)

(72) Inventors: Dong Yeob Lee, Suwon-si (KR); Byung Chul Kim, Suwon-si (KR); Seung Ryong Han, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 17/536,566

(22) Filed: Nov. 29, 2021

(65) Prior Publication Data
US 2022/0087037 A1 Mar. 17, 2022

Related U.S. Application Data

(63) Continuation of application No. 16/509,796, filed on Jul. 12, 2019, now Pat. No. 11,212,926.

(30) Foreign Application Priority Data

Jul. 12, 2018 (KR) .................. 10-2018-0081275

(51) Int. Cl.
*H05K 5/00* (2006.01)
*H05K 1/18* (2006.01)
(Continued)

(52) U.S. Cl.
CPC ......... *H05K 5/0017* (2013.01); *G09F 9/3026* (2013.01); *H01L 25/0753* (2013.01);
(Continued)

(58) Field of Classification Search
None
See application file for complete search history.

(56) References Cited

U.S. PATENT DOCUMENTS 9,489,012 B2 11/2016 Yoon et al.
2013/0135539 A1 5/2013 Kamata
(Continued)

FOREIGN PATENT DOCUMENTS

KR 10-2013-0078661 A 7/2013
KR 10-2014-0082381 A 7/2014
(Continued)

OTHER PUBLICATIONS

Office Action dated Sep. 21, 2020 issued by the United States Patent and Trademark Office in U.S. Appl. No. 16/509,796.
(Continued)

*Primary Examiner* — James Wu
*Assistant Examiner* — Christopher L Augustin
(74) *Attorney, Agent, or Firm* — Sughrue Mion, PLLC

(57) ABSTRACT

A display apparatus includes a PCB on which a plurality of LEDs emitting light in a first direction are mounted, a frame configured to support the PCB, and a chassis coupled to the frame. The frame has a length in a second direction perpendicular to the first direction that is longer than that of the PCB.

12 Claims, 16 Drawing Sheets

(51) Int. Cl.
*H01L 25/075* (2006.01)
*H05K 1/14* (2006.01)
*H01L 25/16* (2006.01)
*G09F 9/302* (2006.01)

(52) U.S. Cl.
CPC ........... *H01L 25/167* (2013.01); *H05K 1/142* (2013.01); *H05K 1/181* (2013.01); *H05K 5/0021* (2013.01); *H05K 2201/10106* (2013.01); *H05K 2201/10128* (2013.01); *H05K 2201/10166* (2013.01); *H05K 2201/10522* (2013.01)

(56) References Cited

U.S. PATENT DOCUMENTS

| | | |
|---|---|---|
| 2013/0170116 A1 | 7/2013 | In et al. |
| 2014/0153241 A1 | 6/2014 | Templeton |
| 2016/0247983 A1 | 8/2016 | Mutschelknaus et al. |
| 2018/0031919 A1* | 2/2018 | Ryu ................. G02F 1/133603 |
| 2020/0124904 A1 | 4/2020 | In et al. |

FOREIGN PATENT DOCUMENTS

| | | | |
|---|---|---|---|
| KR | 10-2014-0124994 A | 10/2014 | |
| WO | WO-2011156344 A2 * | 12/2011 | ........... G09F 27/007 |

OTHER PUBLICATIONS

Office Action dated May 5, 2021 issued by the United States Patent and Trademark Office in U.S. Appl. No. 16/509,796.

Notice of Allowance dated Sep. 1, 2021 issued by the United States Patent and Trademark Office in U.S. Appl. No. 16/509,796.

Communication dated Jul. 27, 2022, issued by the Korean Intellectual Property Office in Korean Patent Application No. 10-2018-0081275.

Communication dated Jan. 10, 2023 by the Korean Intellectual Property Office in Korean Patent Partial Application No. 10-2018-0081275.

* cited by examiner

DISPLAY APPARATUS INCLUDING FRAME FOR SUPPORTING PRINTED CIRCUIT BOARD

CROSS-REFERENCE TO RELATED APPLICATION(S)

This is a continuation of U.S. application Ser. No. 16/509,796, filed on Jul. 12, 2019, which is based on and claims priority under 35 U.S.C. § 119 to Korean Patent Application No. 10-2018-0081275, filed on Jul. 12, 2018 in the Korean Intellectual Property Office, the disclosures of which are incorporated by reference herein in their entireties.

BACKGROUND

1. Field

The disclosure relates to a display apparatus, and more specifically, to a display apparatus including a frame for supporting a printed circuit board (PCB) on which a light emitting diode (LED) is mounted.

2. Description of the Related Art

An LED display apparatus using an LED has superior brightness and color characteristics than other types of display apparatuses (e.g., LCD type display apparatus), and thus is used for indoor/outdoor signboards, indoor/outdoor direction boards, electronic boards of stadiums, or indoor/outdoor backdrops. In addition, the LED display apparatus may easily expand by arranging LEDs in the form of M×N (M and N are natural numbers) matrix.

With increasing demand on the LED display apparatus that can be implemented in a M×N matrix form, there is an increasing need for an LED display apparatus easily moved and installed.

In particular, a PCB on which micro LEDs are mounted needs a low durability.

SUMMARY

According to embodiments of the disclosure, there is provided a display apparatus capable of ensuring rigidity during installment of a PCB on which LEDs are mounted, using a frame for supporting the PCB.

Additional aspects of the disclosure will be set forth in part in the description which follows and, in part, will be obvious from the description, or may be learned by practice of the disclosure.

In accordance with an aspect of the disclosure, there is provided a display apparatus including: a PCB on each of which a plurality of LEDs for emitting light in a first direction are mounted; a frame configured to support the PCB; and a chassis coupled to the frame, wherein a length of the frame in a second direction perpendicular to the first direction is longer than a length of the PCB in the second direction.

A length of the frame in a third direction perpendicular to the second direction may be longer than a length of the PCB in the third direction.

One end of the frame in the second direction may be arranged to correspond to one end of the PCB in the second direction, and an other end of the frame in the second direction may be arranged outward of an other end of the PCB in the second direction from the one end of the frame.

One end of the frame in the third direction may be arranged to correspond to one end of the PCB in the third direction, and an other end of the frame in the third direction may be arranged outward of an other end of the PCB in the third direction from the one end of the frame.

The other end of the frame in the second direction may be arranged outward of the other end of the PCB in the second direction by a distance of 20 micrometers.

The frame may have a thickness of about 3 mm.

The PCB may have a thickness of about 0.7 mm.

The frame may include a layered portion that is layered with the PCB in a front and rear side direction of the PCB and an extending portion laterally extending from the layered portion to be arranged at an outside of the PCB, wherein the extending portion may be arranged at an outside of the PCB in the second direction.

The extending portions may be disposed at an outside of one end of the PCB and an outside of an other end of the PCB in the second direction, respectively.

The extending portion may be disposed at an outside of the PCB in a third direction perpendicular to the second direction.

The frame may include a contact surface coming into contact with the PCB and a receiving portion arranged in the contact surface and configured to receive at least one portion of an adhesive member that bonds the frame to the PCB.

The receiving portion may formed at a central side of the contact surface, and provided to penetrate between the contact surface and an opposite surface of the contact surface The receiving portion includes a receiving groove, and the frame may further include an adhesion surface connected to the receiving groove and on which the frame is bonded to the PCB through the adhesive member.

The adhesion surface may be provided at a height lower than a height of the contact surface.

The adhesion surface may be arranged at a central side of the contact surface, and the receiving grooves may be arranged at opposite ends of the adhesion surface.

In accordance with an aspect of the disclosure, there is provided a display apparatus including: a plurality of printed circuit boards (PCB) on each of which a plurality of LEDs for emitting light in a first direction are mounted and including a first PCB and a second PCB arranged in line with each other in a second direction perpendicular to the first direction; a plurality of frames each configured to support a corresponding one of the plurality of PCBs, the plurality of frames including a first frame configured to support the first PCB and a second frame configured to support the second PCB; and a chassis coupled to the plurality of frames, wherein the first frame and the second frame may be adjacent to each other in the second direction, and the first PCB and the second frame are spaced apart from each other in the second direction.

The first PCB and the second PCB may be spaced apart from each other by a distance of 20 micrometers.

The plurality of LEDs may be mounted on the first PCB and the second PCB to be spaced apart from each other at a predetermined interval in the second direction from one end of the first PCB to an other end of the first PCB and one end of the second PCB to an other end of the second PCB, the other end of the first PCB may be adjacent to the one end of the first PCB; and a distance between a first LED mounted at a nearest position to the other end of the first PCB and a second LED mounted at a nearest position to the one end of the second PCB may be equal to the predetermined interval.

The display apparatus may further include: a third PCB, among the plurality of PCBs on which the plurality of LEDs emitting light in the first direction are mounted, arranged in line with the first PCB in a third direction perpendicular to the second direction; and a third frame, among the plurality of frames each configured to support a corresponding one of the plurality of PCBs, configured to support the third PCB, wherein the first frame and the third frame may be adjacent to each other in the third direction, and the first PCB and the third PCB may be spaced apart from each other in the third direction.

In accordance with an aspect of the disclosure, there is a display apparatus including: a board on which a plurality of LEDs are mounted and having a front side provided in a rectangular shape including four sides; a frame configured to support a rear surface of the board; and a chassis coupled to the frame, wherein the frame includes a layered portion that is layered with the board in a front and rear side direction of the board and an extending portion laterally extending from the layered portion to be arranged at an outside of the board, and wherein the board includes a glass substrate and a TFT layer on which the plurality of LEDs are mounted is formed on the glass substrate, and wherein the extending portion is arranged at an outside of at least one of the four sides of the PCB.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
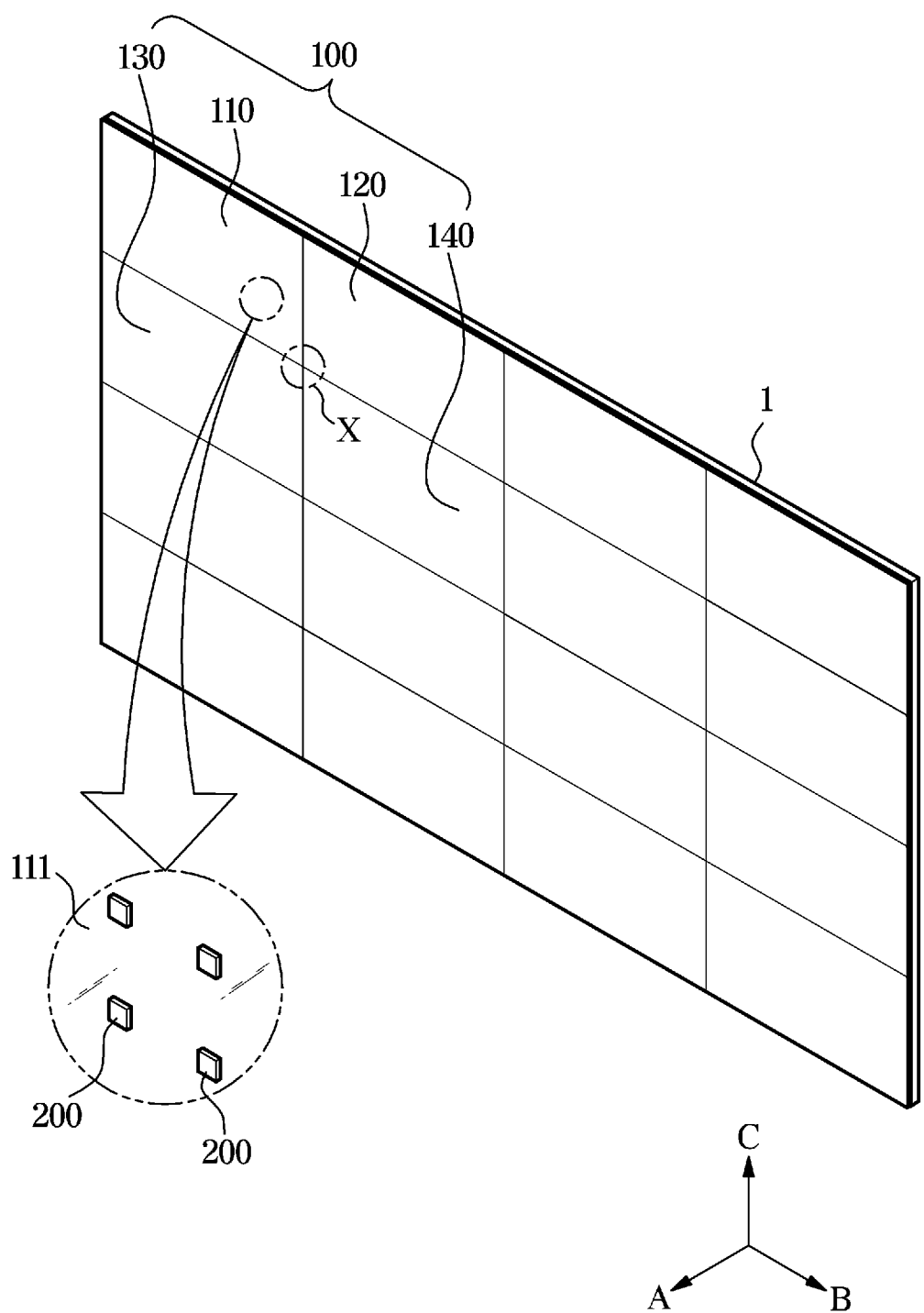
FIG. 1 is a perspective view illustrating a display apparatus according to an embodiment.

Embodiments and features as described and illustrated in the disclosure are only examples, and various modifications thereof may also fall within the scope of the disclosure.

Throughout the drawings, like reference numerals refer to like parts or components.

The terminology used herein is for the purpose of describing particular embodiments only and is not intended to limit the disclosure. It is to be understood that the singular forms "a," "an," and "the" include plural references unless the context clearly dictates otherwise. It will be further understood that the terms "include", "comprise" and/or "have" when used in this specification, specify the presence of stated features, integers, steps, operations, elements, and/or components, but do not preclude the presence or addition of one or more other features, integers, steps, operations, elements, components, and/or groups thereof.

The terms including ordinal numbers like "first" and "second" may be used to explain various components, but the components are not limited by the terms. The terms are only for the purpose of distinguishing a component from another. Thus, a first element, component, region, layer or section discussed below could be termed a second element, component, region, layer or section without departing from the teachings of the disclosure.

Descriptions shall be understood as to include any and all combinations of one or more of the associated listed items when the items are described by using the conjunctive term "~ and/or ~," or the like.

A content may be displayed on a display apparatus. The content may be received from a control device configured to perform control in connection with the display apparatus and/or another display apparatus connected to the display apparatus. In addition, the content may be received from an external server. For example, the content may be a video file or an audio file played in a video player, a music file played in a music player, a photo file displayed on a photo gallery, and a web page file or a text file displayed on a web browser. In addition, the content may include broadcasts received.

Hereinafter, embodiments according to the disclosure will be described in detail with reference to the accompanying drawings.

Figure 2:
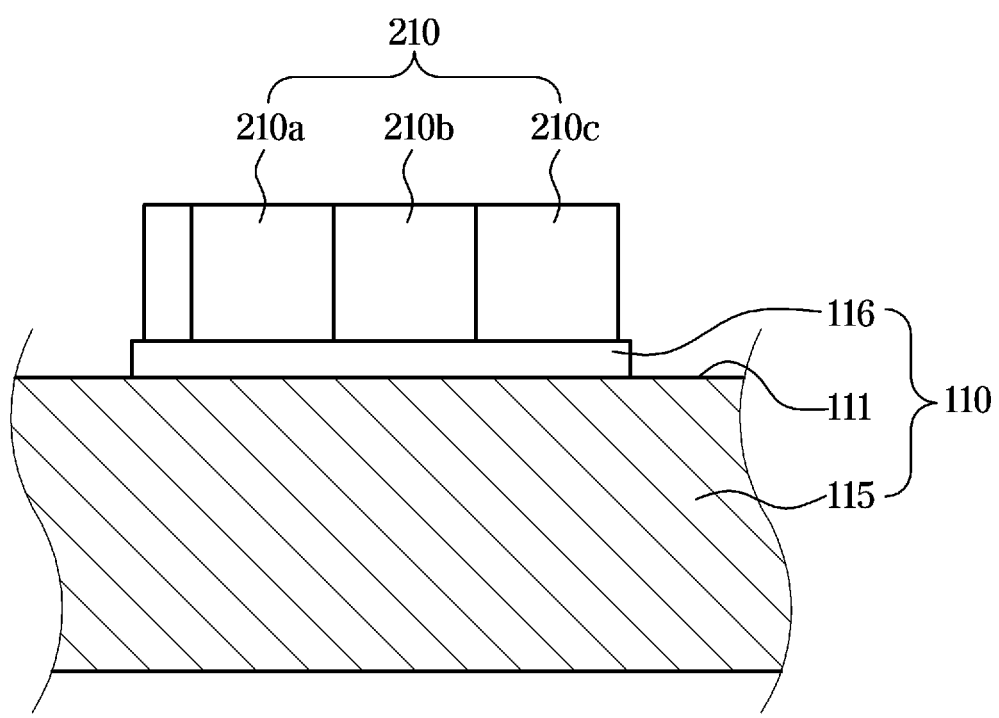
FIG. 2 is a schematic side cross-sectional view illustrating a first PCB of a display apparatus according to an embodiment.
Figure 3:
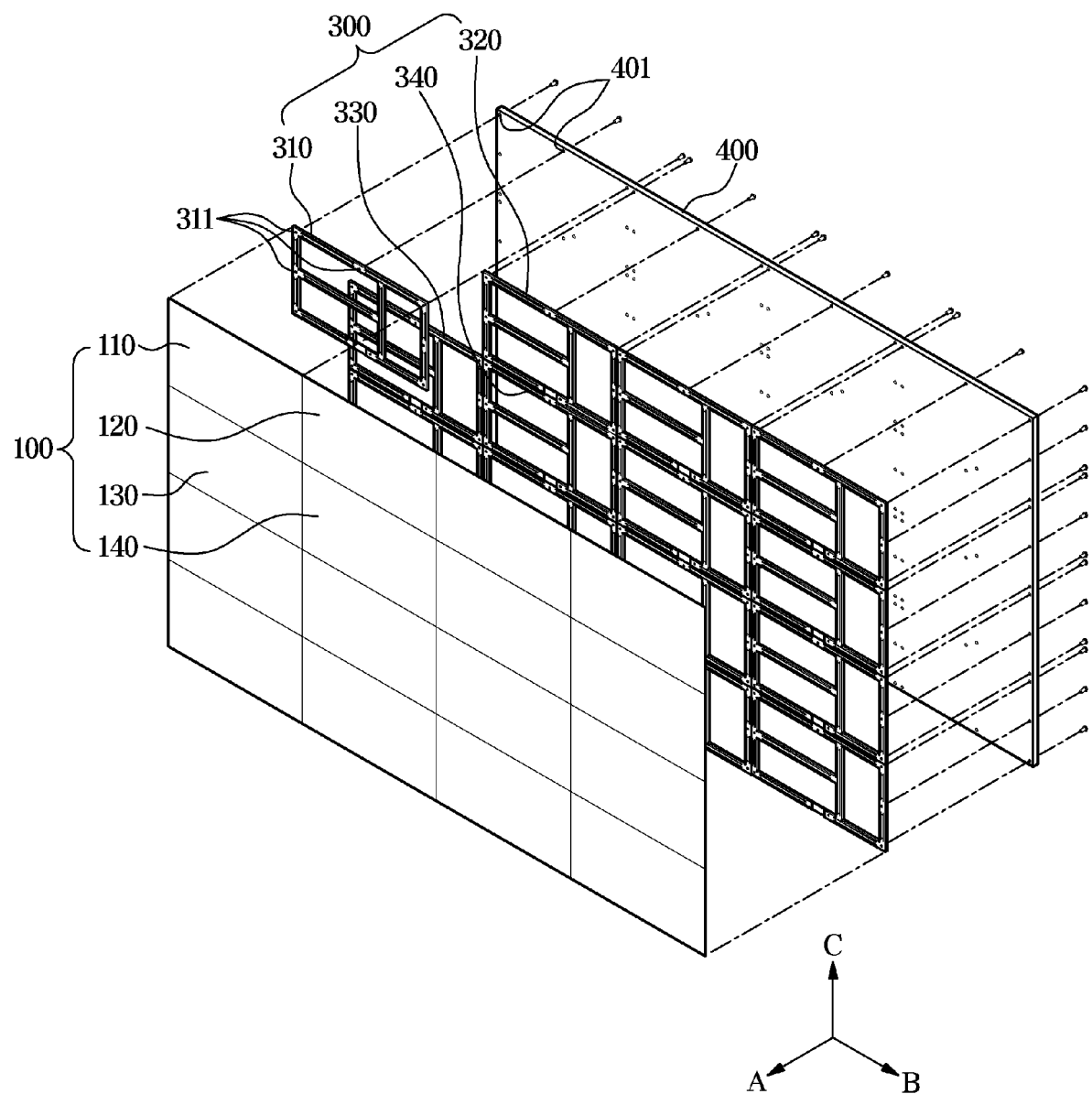
FIG. 3 is an exploded perspective view illustrating a display apparatus according to an embodiment.
Figure 4:
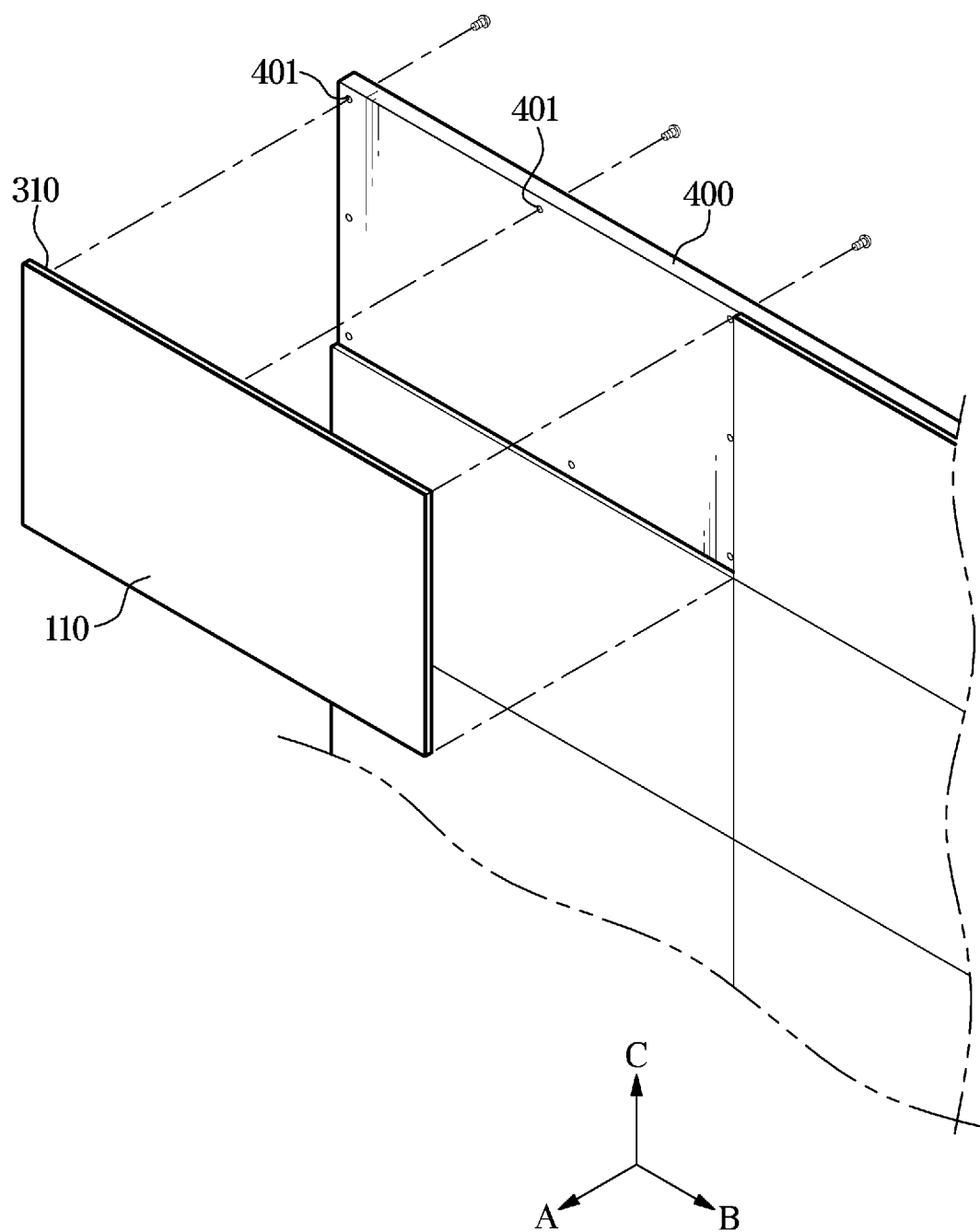
FIG. 4 is a view illustrating a state in which part of a display apparatus according to an embodiment is separated.

FIG. 1 is a perspective view illustrating a display apparatus 1 according to an embodiment, FIG. 2 is a schematic side cross-sectional view illustrating a first PCB of a display apparatus according to an embodiment, FIG. 3 is an exploded perspective view illustrating the display apparatus according to an embodiment, and FIG. 4 is a view illustrating a state in which part of the display apparatus according to an embodiment is separated.

The display apparatus 1 may include a plurality of printed circuit boards (PCBs) 100, on each of which a plurality of LEDs 200 are mounted. The plurality of PCBs 100 may include a first PCB 110, a second PCB 120, a third PCB 130, and a fourth PCB 140, and the plurality of PCBs 100 may be arranged in various forms according to the size of the display apparatus 1.

The plurality of LEDs 200 may be mounted on each of the first PCB 110, the second PCB 120, the third PCB 130, and the fourth PCB 140. Since each of the PCBs 110, 120, 130, and 140 is implemented in the same form, the following description will be made only on the first PCB 110 for the sake of convenience in description.

Figure 5:
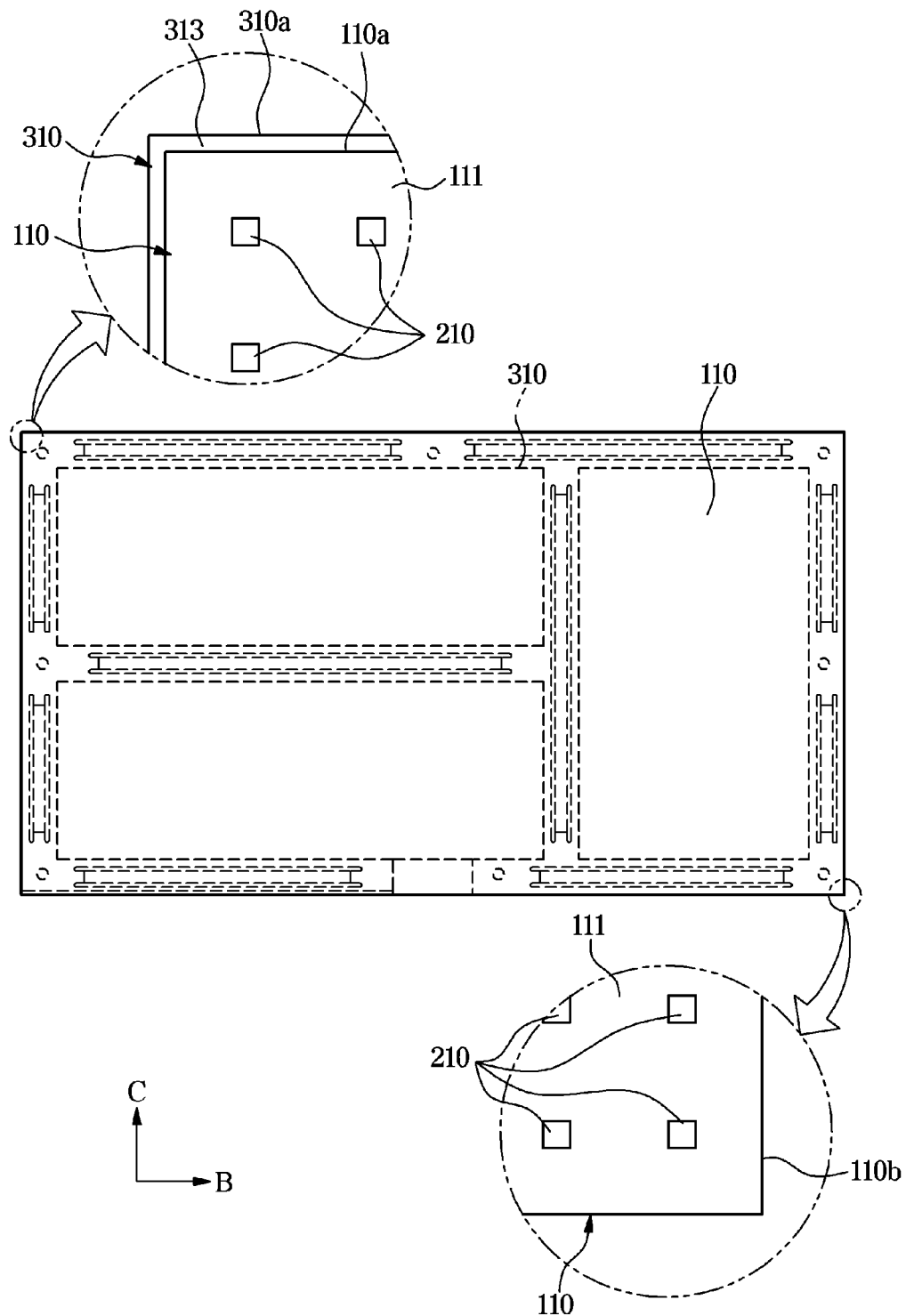
FIG. 5 is a front view illustrating a first PCB and a first frame of a display apparatus according to an embodiment.

The first PCB 110 may include a mounting surface 111 on which the plurality of LEDs 210 are mounted as shown in FIG. 5. The mounting surface 111 is disposed to face in a first direction A, which is a forward direction of the display apparatus 1, and the plurality of LEDs 210 mounted on the mounting surface 111 may emit light in the first direction A The first PCB 110 may include a glass substrate 115 forming the mounting surface 111 and a Thin-Film Transistor (TFT) layer 116 formed on the mounting surface 111.

The first PCB 110 may include a COG (Chip On Glass) type substrate consisted of the glass substrate 115 and the TFT layer 116 for controlling a driving of the plurality of LEDs 210 mounted on the mounting surface 111 of the glass substrate 115.

The plurality of LEDs 210 may be implemented by arranging LEDs emitting red, green, and blue light in the form of a matrix.

The plurality of LEDs 210 may include a red LED 210*a*, a green LED 210*b*, and a blue LED 210*c* packaged in the form of a matrix for a single pixel. A red LED 210*a*, a green LED 210*b*, and a blue LED 2210*c* that implement a single pixel may each be referred to as a sub pixel. A pixel may be implemented by LEDs that represent white color and color filters that filter white color into various colors.

The plurality of LEDs 210 may implement a single pixel with sub-pixels including a red LED 210*a*, a green LED 210*b*, and a blue LED 210*c*, and may be repeatedly arranged.

The plurality of LEDs 210 may be mounted on the mounting surface 111 in the form of a matrix (e.g., M×N, where M and N are natural numbers). The matrix may have the same arrays (e.g., M=N, where M and N are natural numbers, such as a 16×16 array, a 24×24 array, and the like). Alternatively, the matrix may have different arrays (e.g., M N, where M and N are natural numbers).

The display apparatus 1 may implement a screen using the plurality of LEDs 200 mounted on each of the plurality of PCBs 100, and display a content by driving the plurality of LEDs 200.

When the plurality of LEDs 210 are provided using micro LEDs, the plurality of PCBs 100 may be formed of glass to transfer the micro LEDs as the first PCB. In this case, the plurality of PCBs 100 including glass may have following shortcomings when compared to the related art PCBs.

When the plurality of PCBs 100 are formed of glass, there is a limitation in installing the plurality of PCBs 100 on the chassis 400. The related art PCB on which LEDs are mounted is formed of an epoxy resin, a phenol resin, or a composite resin, and in this case, in order to couple the related art PCB to a chassis, a component, such as a stud, is coupled to the PCB using soldering, and the PCB is coupled to the chassis through the stud coupled to the PCB.

Even if the PCB is formed of glass, high temperature heat generated during the soldering of the stud or the like for fixing the PCB may cause deformation of various wirings and applied materials formed on the glass, and cause difficulty in soldering the stud at a correct position.

That is, the PCB may be composed of the glass substrate and the TFT layer formed on the glass substrate, and the wiring and applied material of TFT layer may be deformed by high temperature heat generated during the soldering of the stud or the like for fixing the PCB.

When the plurality of PCBs are installed in the chassis with the PCBs partially deformed or the studs positioned at incorrect positions, the plurality of PCBs may have unintentional gaps and height differences therebetween, which may degrade the reliability of the display screen.

In addition, when the plurality of PCBs 100 are formed of glass, the durability of the PCB is lowered when compared to the related art PCB, and thus the plurality of PCBs 100 having a thin panel shape may be subject to warpage in a process of being arranged on the chassis 400.

In addition, when the plurality of PCBs 100 are formed of glass, the plurality of PCBs 100 may be broken due to an impact in a process of being installed on the chassis 400.

In detail, during the installation of the plurality of PCBs 100, the plurality of PCBs 100 may be broken due to collision with each other, or colliding with the chassis 400 or the like. In particular, since the plurality of PCBs 100 are arranged in a matrix form on the chassis 400, the PCBs 100 adjacent to each other may collide with each other and be broken during the arrangement of the plurality of PCBs 100.

In order to make up for the above described shortcomings, the display apparatus 1 according to the disclosure may include a plurality of frames 300 each supporting a corresponding one of the plurality of PCBs 100. The following description will be made on the assumption that the plurality of LEDs 200 are micro LEDs, but the disclosure is not limited thereto, and the plurality of LEDs 200 may be general LED. In addition, the following description will be made in relation that the plurality of PCBs 100 on which the micro LEDs are mounted take the form of a panel including glass. However, the disclosure is not limited thereto, and the plurality of PCBs 100 may be formed of another material, e.g., epoxy resin.

The display apparatus 1 includes the plurality of frames 300 provided corresponding in number to the number of the plurality of PCBs 100, and before assembly of the plurality of PCBs 100 to the chassis 400, the plurality of PCBs 100 are primarily coupled to the plurality of frames 300, and the plurality of frames 300 having the plurality of PCBs 100 coupled thereto are coupled to the chassis 400.

The plurality of frames 300 includes a first frame 310 for supporting the first PCB, a second frame 320 for supporting the second PCB 120, a third frame 330 for supporting the third PCB 130, and a fourth frame 340 for supporting the fourth PCB 140. Each of the frames 300 has the same form, and the following description will be made in relation to only the first frame 310 for the sake of convenience in description.

Figure 6:
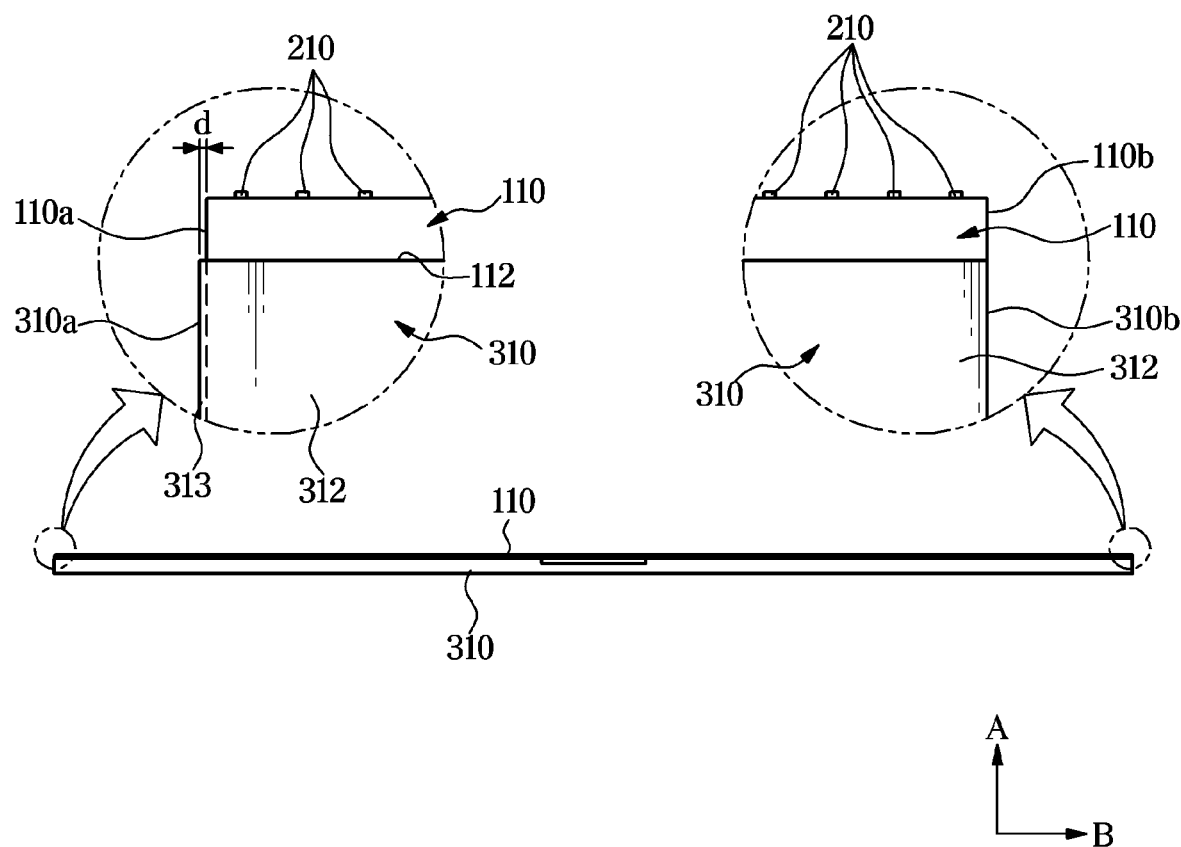
FIG. 6 is a side view illustrating a first PCB and a first frame of a display apparatus according to an embodiment.

The first frame 310 may support the first PCB 110 while in contact with an opposite surface 112 opposite to the mounting surface 111 of the first PCB 110 (see FIG. 6).

The display apparatus 1 may include an electric unit electrically connected to the first PCB 110 to transmit an electrical signal to the first PCB 110 such that an image is displayed from the plurality of LEDs 210. The electric unit may be seated in a seating space provided inside the first frame 310. The seating space is an opening that is opened outward from the inside of the first frame 310.

The display apparatus 1 may include the chassis 400 coupled to the plurality of frames 300. The chassis 400 may secure the plurality of PCBs 100 through the plurality of frames 300. That is, the chassis 400 may be coupled to the plurality of frames 300 to thereby secure the plurality of PCBs 100.

The first frame 310 may be coupled to the chassis 400 in various coupling methods, such as screwing, magnetic force coupling, latching, or the like. According to an embodiment, the first frame 310 includes a first coupling hole 311, and the chassis 400 includes a second coupling hole 401 to be screwed with the first coupling hole 311. Accordingly, the first frame 310 and the chassis 400 may be screwed to each other.

As the PCB 100 is coupled to the chassis 400 through the frame 300 as described above, the PCB 100 is easily assembled to the chassis 400. Accordingly, when any one of the plurality of PCBs 100 needs to be replaced due to breakage or the like, a frame corresponding to the PCB is unscrewed from the chassis 400 so that the corresponding PCB is easily replaced.

As will be described below, the plurality of PCBs 100 may be coupled to the plurality of frames 300, respectively, by adhesive members 317, so that the plurality of PCBs 100 may be coupled to the plurality of frames 300, respectively, without being deformed due to high temperature heat or physical force applied thereto.

It is not that the coupling members, such as a stud, are arranged on particular areas of the plurality of PCBs 100, but that the plurality of PCBs 100 are easily arranged on the plurality of frames 300 using a jig or other similar devices, and then are coupled to the plurality of frames 300, respectively.

Accordingly, the plurality of PCBs 100 may not have unintentional gaps therebetween during arrangement on the chassis 400, and may be coupled to the chassis 400 without having physically deformation, therefore an image implemented through the plurality of PCBs 100 may be displayed without distortion.

As described above, the plurality of frames 300 may support the plurality of PCBs 100 while making entire contact with the opposite surfaces of the mounting surfaces of the plurality of PCBs 100, so that the plurality of PCBs 100 are prevented from being warped.

For example, the first frame 310 is provided to make contact with the entire edge of the opposite surface 112 of the first PCB 110, so that the first PCB 110 is prevented from being warped or distorted, to thereby improve the durability of the first PCB 110 (see FIG. 5).

In addition, when the plurality of PCBs 100 are installed on the chassis 400 through the plurality of frames 300, a breakage that may be caused by a contact between the plurality of PCBs may be prevented. This will be described below in detail with reference to the configuration of the plurality of frames 300.

Figure 7:
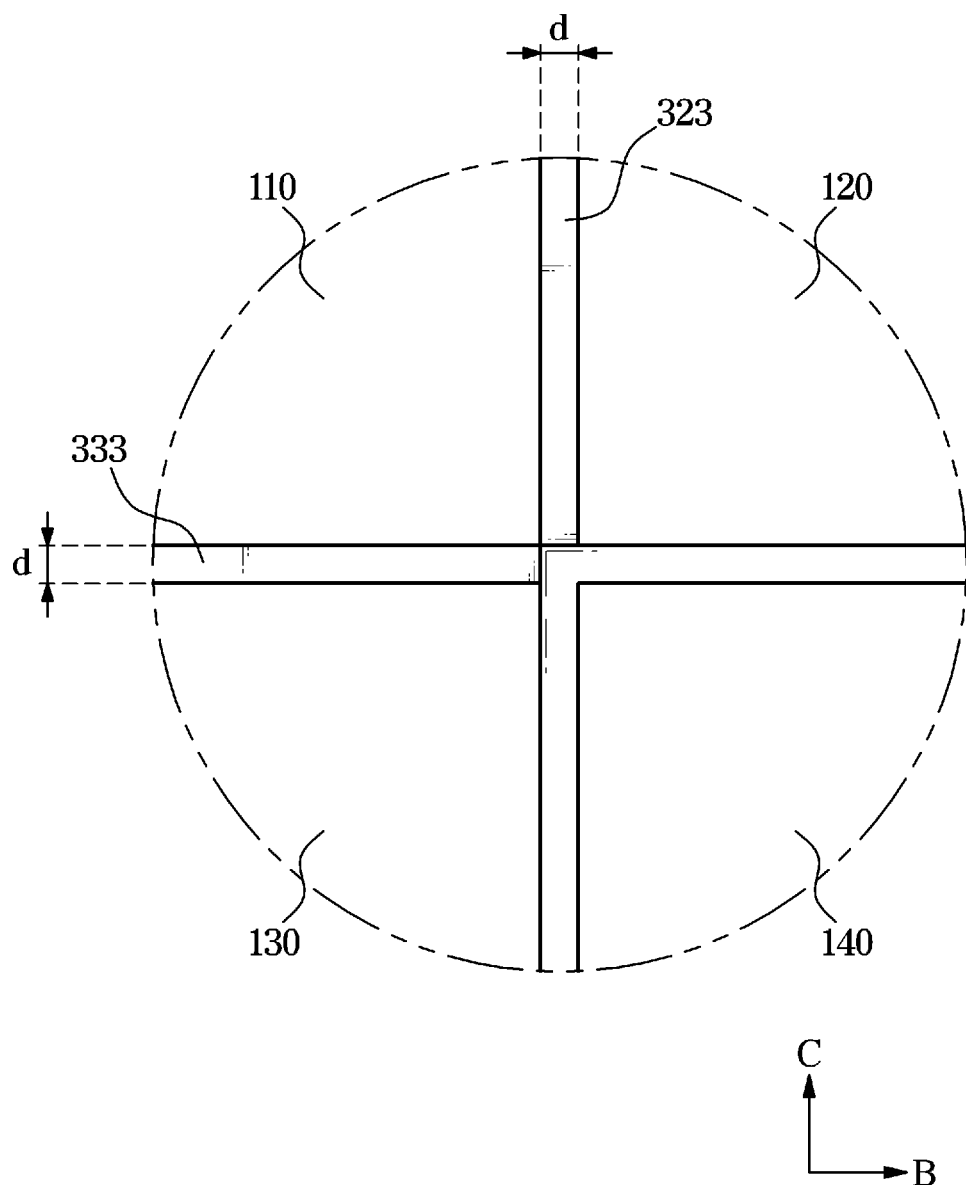
FIG. 7 is an enlarged front view illustrating portion X of FIG. 1.
Figure 8:
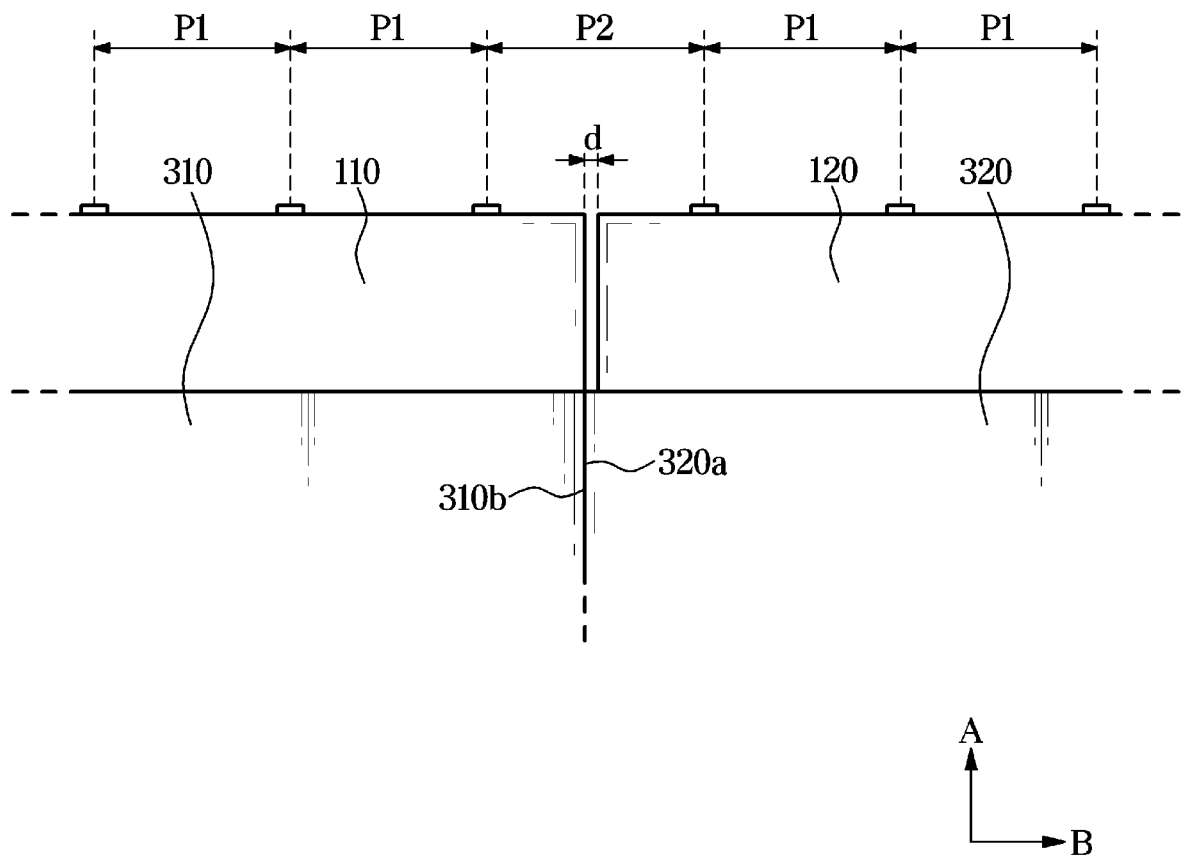
FIG. 8 is a side view illustrating a configuration of part of a display apparatus according to an embodiment.

FIG. 5 is a front view illustrating the first PCB and the first frame of the display apparatus according to an embodiment, FIG. 6 is a side view illustrating the first PCB and the first frame of the display apparatus according to an embodiment, FIG. 7 is a front view in which portion X of FIG. 1 is enlarged, and FIG. 8 is a side view illustrating a configuration of part of the display apparatus according to an embodiment.

Referring to FIGS. 5 and 6, the first frame 310 may support the opposite surface 112 of the mounting surface 111 corresponding to the rear surface of the first PCB 110. In detail, the first frame 310 is disposed to come into contact with a rim of the opposite surface 112 and a portion inside the rim, and supports the first PCB 110 by the part of the opposite surface 122 in contact with the first frame 310.

A portion of the first frame 310 may be provided to extend outward of the rim of the first PCB 110.

In detail, in a second direction B perpendicular to the first direction A (the forward direction of the display apparatus 1), the first frame 310 has a length longer than that of the first PCB 110.

In addition, in a third direction C perpendicular to the second direction B, the first frame 310 has a length longer than that of the first PCB 110.

In other words, the first frame 310 includes a layered portion 312 layered with the first PCB 110 in the first direction A and an extending portion 313 laterally extending from the layered portion 312 to be arranged at an outside of the first PCB 110. In this case, the extending portion 313 may be arranged at an outside of at least one of four sides of the first PCB 110.

In detail, the four sides of the first PCB 110 when viewed in the first direction A includes a first side 110a among a pair of opposite sides in the second direction B, and at the first side 110a, the extending portion 313, which is a portion of the first frame 310 disposed at a rear of the first PCB 110, is arranged outward of the first side 110a of the first PCB 110 in the second direction B.

In contrast, at a second side 110b of the first PCB 110 that faces the first side 110a among the pair of opposite sides in the second direction B, the extending portion 313 of the first frame 310 is not arranged, and the second side 110b and a lateral side 310b of the layered portion 312 are arranged in alignment with each other in the first direction A.

As such, the extending portion 313 is disposed only at the first side 110a of the first PCB in the second direction B, so that the first frame 310 is arranged asymmetrically with respect to the first PCB 110.

In addition, the four sides of the first PCB 110 when viewed in the first direction A includes a first side 110a among a pair of opposite sides in the third direction C, and at the first side 110a, the extending portion 313, which is a portion of the first frame 310 disposed at a rear of the first PCB 110, is arranged outward of the first side 110a of the first PCB 110 in the third direction C.

In contrast, at a second side 110b of the first PCB 110 that faces the first side 110a among the pair of opposite sides in the third direction C, the extending portion 313 of the first frame 310 is not arranged, and the second side 110b and a lateral side 310b of the layered portion 312 are arranged in line with each other in the first direction A.

That is, the extending portions 313 may be provided to be arranged at the outsides of the two first sides 110a (one of the pair of sides to be opposite in the second direction and one of the pair of sides to be opposite in the third direction). In addition, the extending portions 313 are not arranged at the two second sides 110b such that the two second sides 110b are each arranged in line with the portion 310b (a portion of the rim) of the first frame 310 in the first direction A.

Referring to FIG. 5, when viewed from the front of the first PCB 110, the first frame 310 protrudes outward of the first PCB 110 at an upper side in the second direction B and at a left side in the third direction C. In addition, the first PCB 110 overlap overlaps the first frame 310 in alignment with each other in the front and rear side direction at a right side and a lower side.

However, the disclosure is not limited thereto, and the extending portion 313 may be provided to protrude only in one of the second direction B and the third direction C. That is, the extending portions 313 according to an embodiment are arranged at the outsides of two of the four sides 110a of the first PCB 110 when viewed in the first direction A, but the extending portion 313 according to another embodiment may be arranged at an outside of only one of the four sides when viewed in the first direction A.

The lateral side 310a of the extending portion 313 and the first side 110a of the first PCB 110 may be spaced apart from each other at a distance d of about 20 micrometers. The distance d may be appropriate when the first PCB 110 has a thickness less than 1 millimeter. In addition, the distance d may be appropriate when the first frame 310 has a thickness of about 3 millimeters, but the thickness of the first frame 310 is not limited thereto.

The distance d of 20 micrometers is a distance value set to prevent the plurality of PCBs 100 from making direct contact with each other when the plurality of PCBs 100 are disposed in parallel with each other in the process of being coupled to the plurality of frames 300 and assembled to the chassis 400. In addition, the distance d may be a distance set to prevent gaps between the plurality of PCBs 100 from being perceived to a user when the user views the display apparatus 1 including the plurality of PCBs 100 arranged as such.

Referring to FIG. 7, when the plurality of PCBs 100 are arranged in the chassis 400, the plurality of PCBs 100 may be disposed to be surrounded by the extending portions corresponding thereto when viewed in the first direction A. That is, at the outsides of the two first sides 110*a* of the first PCB, the extending portions 313 of the first frame 310 are arranged as described above, and at the outsides of the two second sides 110*b* of the first PCB 110, an extending portion 323 of the second frame 320 and an extending portion 333 of the third frame 330 may be arranged, respectively.

As described above, the plurality of LEDs 200 are mounted on each of the plurality of PCBs 100 at equal intervals. This is because, when some of the plurality of LEDs 200 are arranged at different intervals, the entire display image of the display apparatus 1 is partly distorted.

Accordingly, referring to FIG. 8, when a plurality of LEDs 200 mounted on each of the plurality of PCBs 100 are spaced apart from each other at an interval of P1, the interval P1 may be provided to be equal to an interval P2 between an LED 211 among a plurality of LEDs 210 mounted on the first PCB 110, arranged at the nearest position to a second side 110*b* of the first PCB 110 adjacent to the second PCB 120 in the second direction B and an LED 221 among a plurality of LEDs 220 mounted on the second PCB 120, arranged at the nearest position to a first side 120*a* of the second PCB 120 adjacent to the first PCB 110 in the second direction B.

That is, assuming that the interval P1 has a length of about 100 micrometers, a distance between the first side 120*a* and the LED 221 arranged at the nearest position to the first side 120*a* may be provided in about 40 micrometers since the distance d is about 20 micrometers. In addition, a distance between the second side 110*b* and the LED 211 arranged at the nearest position to the second side 110*b* may also be provided in about 40 micrometers.

As the lengths of the intervals P1 and P2 are provided equal to each other, even when the plurality of PCBs 100 are arranged in the chassis 400, the plurality of LEDs 200 are provided at equal intervals as a whole.

Accordingly, when the plurality of PCBs 100 are arranged in the chassis 400, the plurality of PCBs 100 are arranged at a distance of d, and the plurality of frames 300 are arranged adjacent to each other without a distance therebetween.

Hereinafter, a plurality of frames according to an embodiment will be described. The plurality of frames are provided in the same form, and the following description will be made only on a first frame 310'. In addition, components except for the first frame 310' are the same as those of the previous embodiment, and therefore a description thereof will be omitted.

Figure 9:
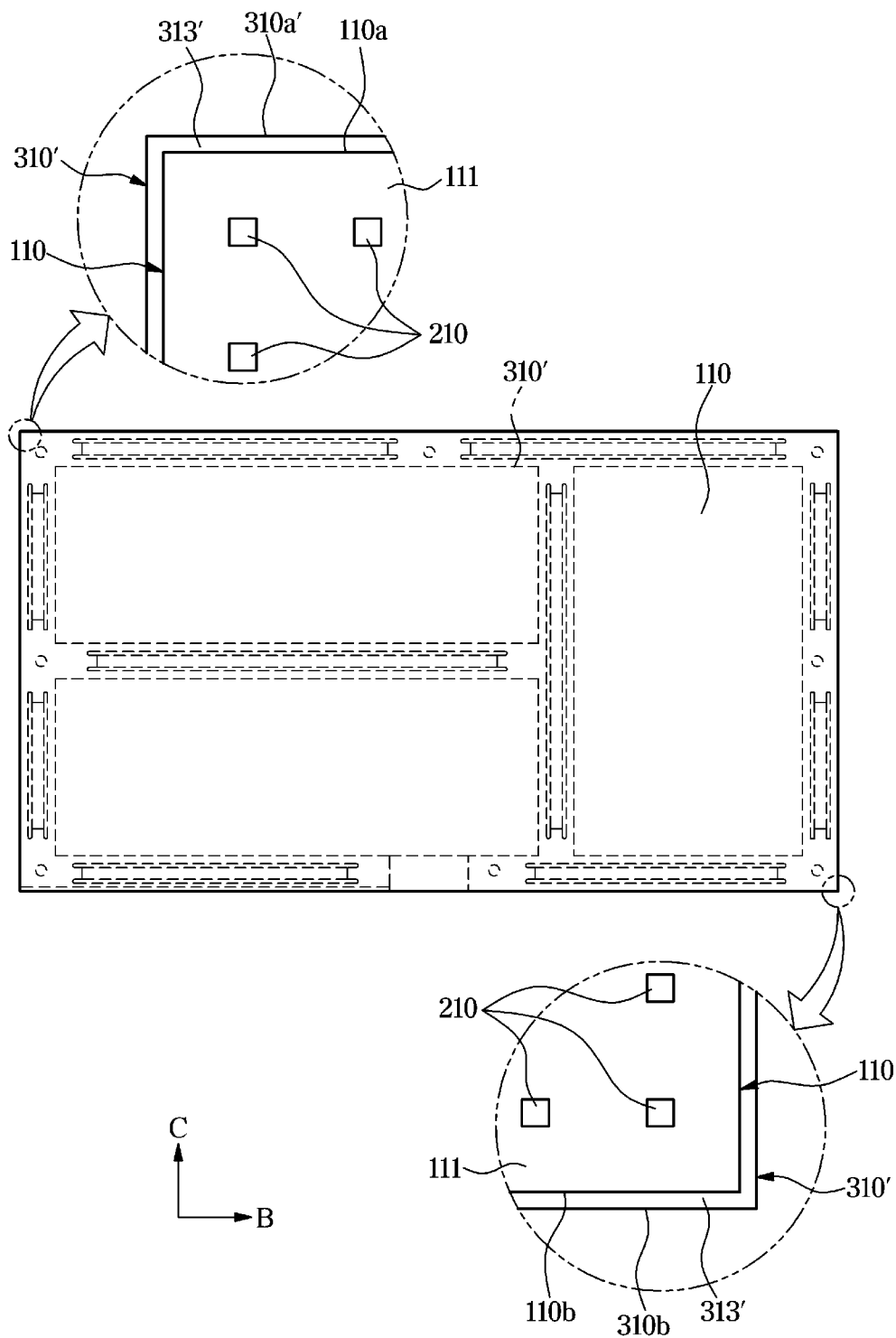
FIG. 9 is a front view illustrating a configuration of part of a display apparatus according to an embodiment.
Figure 10:
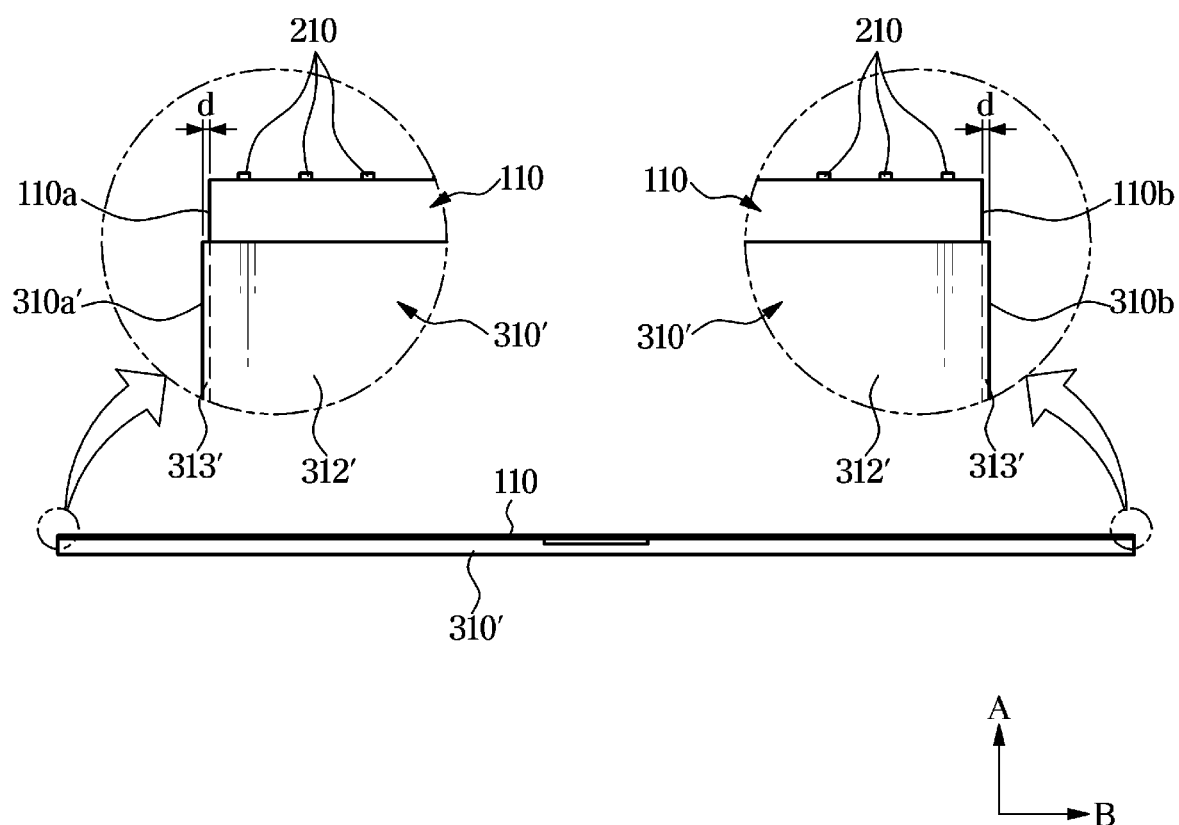
FIG. 10 is a side view illustrating a configuration of part of a display apparatus according to an embodiment.

FIG. 9 is a front view illustrating a configuration of part of a display apparatus according to an embodiment, and FIG. 10 is a side view illustrating a configuration of part of a display apparatus according to an embodiment.

Referring to FIGS. 9 and 10, the first frame 310' may include extending portions 313' arranged at the outsides of two first sides 110*a* and two second sides 110*b* of the first PCB 110.

That is, the extending portions 313 according to the previous embodiment are arranged only at the outsides of two of the four sides of the first PCB 110, but the extending portion 313' according to an embodiment may be arranged at the outsides of four sides 110*a* and 110*b* of the first PCB 110.

Accordingly, the first frame 310' is provided to protrude outward of the four sides of the first PCB 110 in the second direction B and the third direction C by a length of d. That is, the extending portions 313' may be arranged at opposite sides of a layered portion 320' of the first frame 310' in the second direction B and the third direction C.

Accordingly, the plurality of PCBs 100 are arranged in the chassis 400 to be spaced apart from each other by a distance of 2d.

The following description will be made in relation again to the plurality of frames 300 according to the previous embodiment and the construction in which the plurality of frames 300 are coupled to the plurality of PCBs 100.

Figure 11:
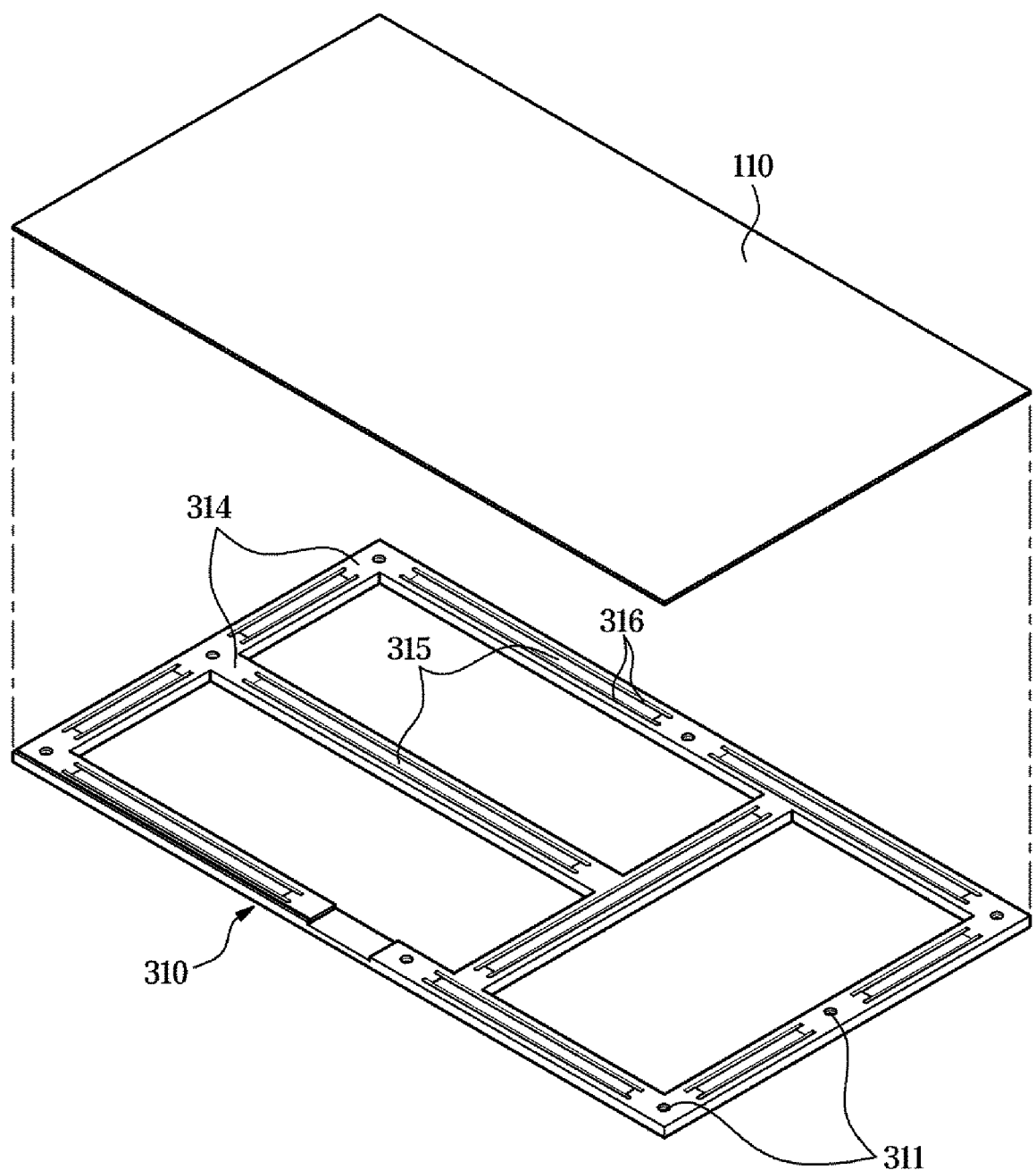
FIG. 11 is a perspective view illustrating a frame of a display apparatus according to an embodiment.
Figure 12A:
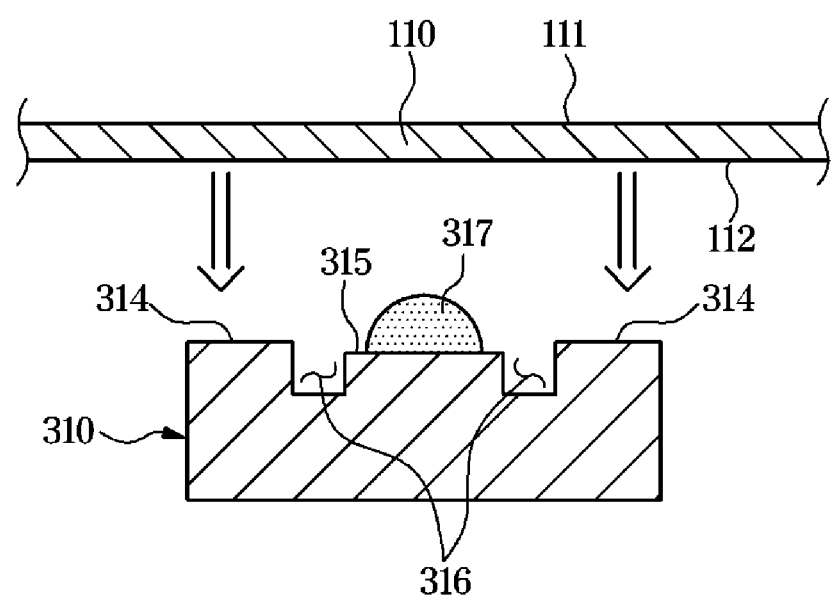
FIGS. 12A and 12B are views showing a sequence in which components of a display apparatus according to an embodiment are coupled to each other.
Figure 12B:
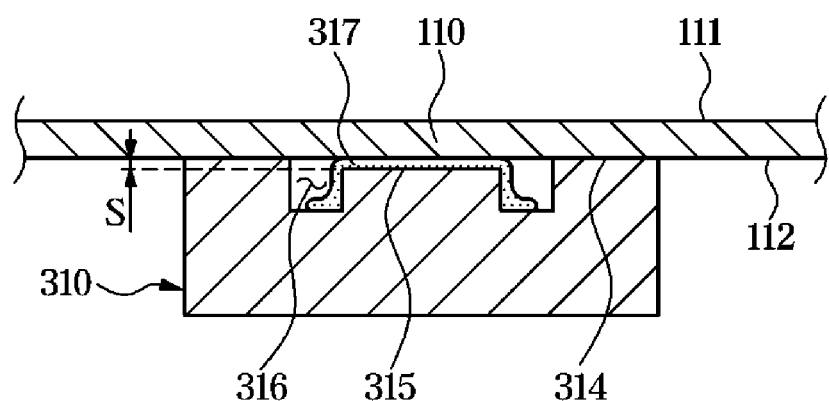
Figure 13:
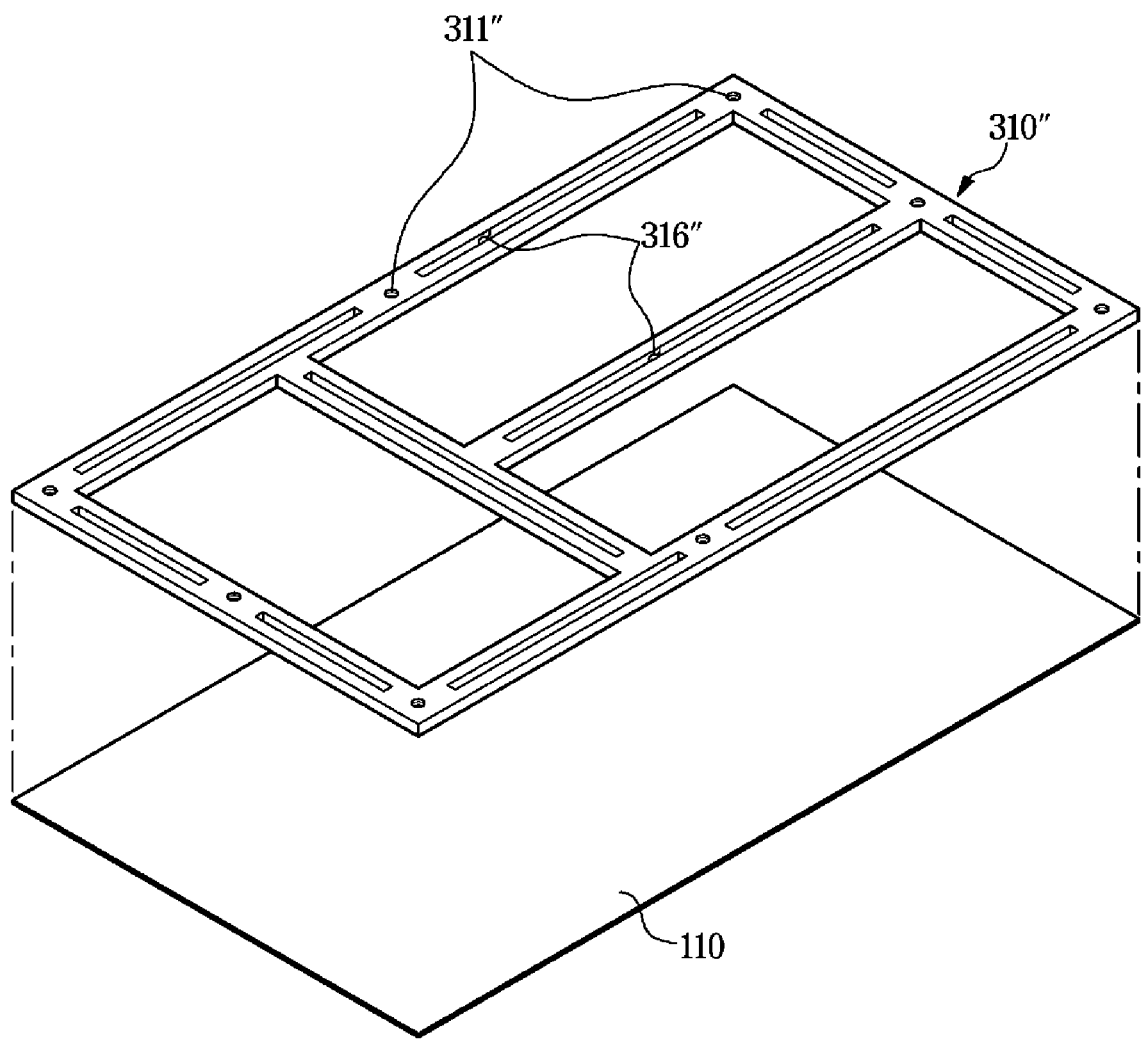
FIG. 13 is a perspective view illustrating a frame of a display apparatus according to an embodiment.

FIG. 11 is a perspective view illustrating a frame of the display apparatus according to an embodiment, FIGS. 12A and 12B are views showing a sequence in which some components of a display apparatus according to an embodiment are coupled to each other, and FIG. 13 is a perspective view illustrating a frame of a display apparatus according to an embodiment.

The first frame 310 may include a contact surface 314 that makes contact with the first PCB 110. The contact surface 314 is a surface that makes contact with a rear surface of the first PCB 110 and serves to stably support the first PCB 110.

The first frame 310 may further include an adhesion surface 315 that is bonded to the first PCB 110 by an adhesive member 317. The adhesion surface 315 is an area in which the adhesive member 317 is disposed in the coupling process and to which the first PCB 110 is bonded through the adhesive member 317 as the first PCB 110 makes contact with the first frame 310.

The adhesive member 317 may be formed of an ultraviolet (UV) curable resin. When the adhesive member 317 is coated on the adhesion surface 315 before the first PCB 110 comes contact with the first frame 310 as shown in FIG. 12A, and as the first PCB 110 comes into contact with the first frame 310, the adhesive member 317 is spread by being pressed by the first PCB 110 as shown in FIG. 12B. Thereafter, when the adhesive member 317 is irradiated with UV, the adhesive member 317 between the first PCB 110 and the adhesion surface 315 may be cured. Accordingly, the first PCB 110 is bonded and coupled to the adhesion surface 315 by the cured adhesive member 317.

The adhesion surface 315 may have a height lower than that of the contact surface 314 to form an area in which the adhesive member 317 is positioned between the adhesion surface 315 and the first PCB 110. That is, a level difference S is formed between the contact surface 314 and the adhesion surface 315.

The first frame 310 may further include receiving grooves 316 connected to the adhesion surface 315 and formed at opposite ends of the adhesion surface 315.

When the adhesive member 317 is pressed by a contact between the first frame 310 and the first PCB 110, the receiving grooves 316 may prevent the adhesive member 317 from being leaking outward of the first frame 310 or being introduced into the contact surface 314.

When the adhesive member 317 is introduced into the contact surface 314, the adhesive member 317 between the contact surface 314 and the first PCB 110 may be cured and therefore may cause a portion of the first PCB 110 to be supported by the first frame 310 at a height different from that of the remaining portion, so that the display image of the display apparatus 1 may be partly distorted.

In order to prevent such a distortion of the image, the first frame 310 further includes the receiving grooves 316 so that part of the adhesive member 317 leaking outward of the adhesion surface 315 is received in the receiving grooves 316 connected to the adhesion surface 315 and therefore is prevented from leaking outward of the first frame 310 and introduced to the contact surface 314.

The adhesion surface 315 may be arranged on the central side of the contact surface 314 with respect to the side section of the first frame 310, and the receiving grooves 316 may be disposed on the opposite ends of the adhesion surface 315.

Hereinafter, a plurality of frames according to an embodiment will be described. The plurality of frames are provided in the same form, and the following description will be made only on a first frame 310". In addition, components except for the first frame 310" are the same as those of the previous embodiment, and therefore a description thereof will be omitted.

In the case of the first frame 310 according to embodiments described above, the adhesive member 317 provided on the adhesion surface 315 is cured when the first PCB 110 is in contact with the first frame 310. As described above, since the first PCB 110 is formed of glass, when the first PCB 110 is irradiated with the UV transmitted through the first PCB 110 to the adhesive member 317.

However, when the first PCB 110 is formed of opaque material, UV irradiated toward the first PCB 110 does not reach the adhesive member 317 because the first PCB 110 does not transmit the UV. Accordingly, UV curing does not occur.

In order to make up for this shorting, the first frame 310" according to an embodiment may include a receiving hole 316" passing through the first frame 310" in the first direction A.

The receiving hole 316" may be provided to pass from a contact surface 314" coming into contact with the first PCB 110 to an opposite surface of the contact surface 314". Accordingly, different from the first frame 310 according to the above embodiment, the first frame 310" according to an embodiment is opened to the outside even at the opposite surface, so that when UV is irradiated to the first frame 310" from a side of the opposite surface, the adhesive member 317 received in the receiving hole 316" may be cured.

In detail, the first frame 310" may include a contact surface 314" that makes contact with the first PCB 110, and with respect to the side section of the first frame 310", the receiving grooves 316" passing through the first frame 310" is provided at the central side of the contact surface 314".

Figure 14A:
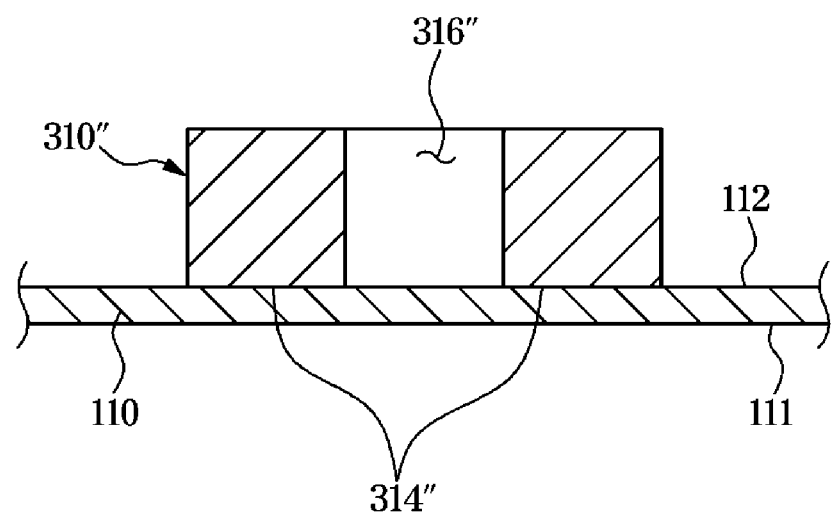
FIGS. 14A and 14B are views illustrating a sequence in which components of a display apparatus according to an embodiment are coupled to each other.
Figure 14B:
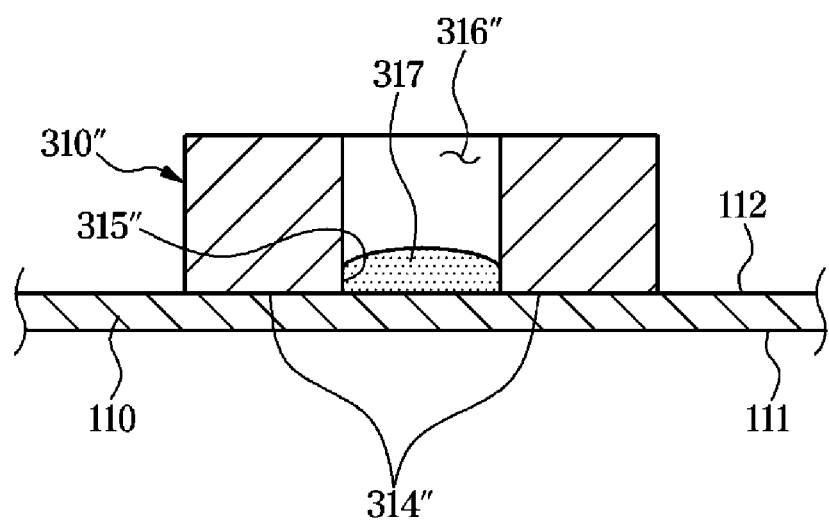

When the first PCB 110 is coupled to the first frame 310", the first PCB 110 is arranged to come into contact with the contact surface 314" as shown in FIG. 14A, and the adhesive member 317 may be coated on the opposite surface being opposite to the contact surface 314" on which the first PCB 110 is arranged as shown in FIG. 14B.

The adhesive member 317 is received in the receiving hole 316" via the opposite side opening of the receiving hole 316", and is cured when the opposite side opening of the receiving hole 316" is irradiated with UV.

As the adhesive member 317 is cured, part of the inside of the receiving hole 316" may form an adhesion surface 315" that is bonded and coupled to the first PCB 110. The adhesion surface 315" bonded with the adhesive member 317 may be coupled to the first PCB 110 through the adhesive member 317.

As is apparent from the above, a frame coupled to a PCB on which LEDs are mounted can allow the PCB to be easily coupled to a chassis, and a plurality of frames coupled to a plurality of PCBs, respectively, at a time of arranging the plurality of PCBs to the chassis can prevent the plurality of PCBs from being broken.

Although few embodiments of the disclosure have been shown and described, the above embodiment is illustrative purpose only, and it would be appreciated by those skilled in the art that changes and modifications, which have not been illustrated above, may be made in these embodiments without departing from the principles and scope of the disclosure, the scope of which is defined in the claims and their equivalents.

What is claimed is:

1. A display apparatus comprising:
   a printed circuit board (PCB) comprising:
      a rear surface,
      a mounting surface on which a plurality of light emitting diodes (LEDs) for emitting light in a first direction are mounted and which opposes the rear surface,
      a first side surface which connects the rear surface and the mounting surface, and
      a second side surface facing the first side surface in a second direction perpendicular to the first direction;
   a frame which is configured to support the rear surface of the PCB; and
   a chassis coupled to the frame,
   wherein the frame comprises:
      a layered portion which overlaps the rear surface of the PCB and comprises a first edge and a second edge facing the first edge in the second direction, wherein the first edge of the layered portion is aligned with the first side surface of the PCB in the first direction, and the second edge of the layered portion forms an edge of the frame and is aligned with the second side surface of the PCB in the first direction, and
      an extending portion which protrudes outward from the first edge of the layered portion in the second direction, forms another edge of the frame that is opposite to the edge of the frame in the second direction, and extends along a periphery of the layered portion in a third direction perpendicular to the second direction,
   wherein the PCB is arranged on the frame asymmetrically at least in the second direction.

2. The display apparatus of claim 1, wherein a length of the frame in the third direction is longer than a length of the PCB in the third direction.

3. The display apparatus of claim 2, wherein one end of the frame in the third direction is arranged to be aligned with one end of the PCB in the third direction, and
   another end of the frame that faces the one end of the PCB in the third direction is arranged outward of another end of the PCB, in the third direction.

4. The display apparatus of claim 1, wherein the other edge of the frame is arranged outward of the first side surface of the PCB by a distance of about 20 micrometers.

5. The display apparatus of claim 4, wherein the frame has a thickness of about 3 mm.

6. The display apparatus of claim 5, wherein the PCB has a thickness of about 0.7 mm.

7. The display apparatus of claim 1, wherein the extending portion is disposed at an outside of the PCB in the third direction.

8. The display apparatus of claim 1, wherein the frame includes a contact surface coming into contact with the PCB and a receiving portion formed in the contact surface and configured to receive at least one portion of an adhesive member that bonds the frame to the PCB.

9. The display apparatus of claim 8, wherein the receiving portion is formed at a central portion of the contact surface, and provided to penetrate between the contact surface and an opposite surface of the contact surface.

10. The display apparatus of claim 8, wherein the receiving portion includes a receiving groove, and
the frame further includes an adhesion surface connected to the receiving groove and on which the frame is bonded to the PCB through the adhesive member.

11. The display apparatus of claim 10, wherein the adhesion surface is provided at a height lower than a height of the contact surface.

12. The display apparatus of claim 10, wherein the adhesion surface is arranged at a central portion of the contact surface, and
the receiving groove is one of receiving grooves that are arranged at opposite ends of the adhesion surface.

* * * * *